United States Patent [19]

Doemens et al.

[11] Patent Number: 4,777,432

[45] Date of Patent: Oct. 11, 1988

[54] DEVICE FOR ELECTRICALLY CHECKING PRINTED CIRCUIT BOARDS

[75] Inventors: Guenter Doemens, Holzkirchen; Manfred Glieden, Munich, both of Fed. Rep. of Germany

[73] Assignee: Siemens Aktiengesellschaft, Berlin and Munich, Fed. Rep. of Germany

[21] Appl. No.: 902,925

[22] Filed: Sep. 2, 1986

[30] Foreign Application Priority Data

Sep. 4, 1985 [DE] Fed. Rep. of Germany ....... 3531604

[51] Int. Cl.⁴ .................................................. G01R 31/02
[52] U.S. Cl. ........................... 324/73 PC; 324/158 F; 324/523
[58] Field of Search ............... 324/51, 54, 62, 64, 324/73 PC, 158 P, 158 F; 340/758, 775, 776, 779; 365/116

[56] References Cited

U.S. PATENT DOCUMENTS

| | | | |
|---|---|---|---|
| 3,800,296 | 3/1974 | Weber | 365/116 X |
| 3,946,381 | 3/1976 | Johnson et al. | 365/116 |
| 4,047,077 | 9/1977 | Veith | 340/769 |
| 4,066,929 | 1/1978 | Okamoto et al. | 365/116 X |
| 4,176,297 | 11/1979 | Thistle et al. | 365/116 X |
| 4,600,878 | 7/1986 | Doemens et al. | 324/51 |

FOREIGN PATENT DOCUMENTS 0102565  3/1984  European Pat. Off. .
0107771  5/1984  European Pat. Off. .

OTHER PUBLICATIONS

H. Bohlen et al., "Tester for Electric Conductors", vol. 14, #5, IBM Technical Disclosure Bulletin (Oct. 1971) p. 1601.
H. J. Meixner "Federnde Prüfspitzen-wichtiges Zubehör in . . . " Electronik Produktion & Prüftechnik (Nov. 1979), pp. 472–473.

Primary Examiner—Reinhard J. Eisenzopf
Assistant Examiner—Stephen M. Baker
Attorney, Agent, or Firm—Hill, Van Santen, Steadman & Simpson

[57] ABSTRACT

An apparatus for electrical function checking of wiring matrices includes a carrier plate having a plurality of gas discharge channels therein is put in place on a wiring matrix to be checked and selected test locations of the wiring matrix are ionically contacted through the gas discharge channels. Each gas discharge channel is equipped with at least two electrodes and is selectable in accordance with the coincidence principle by electrode bus bars that are preferably arranged in the form of rows so that a matrix addressing of selected test locations can be undertaken.

20 Claims, 4 Drawing Sheets

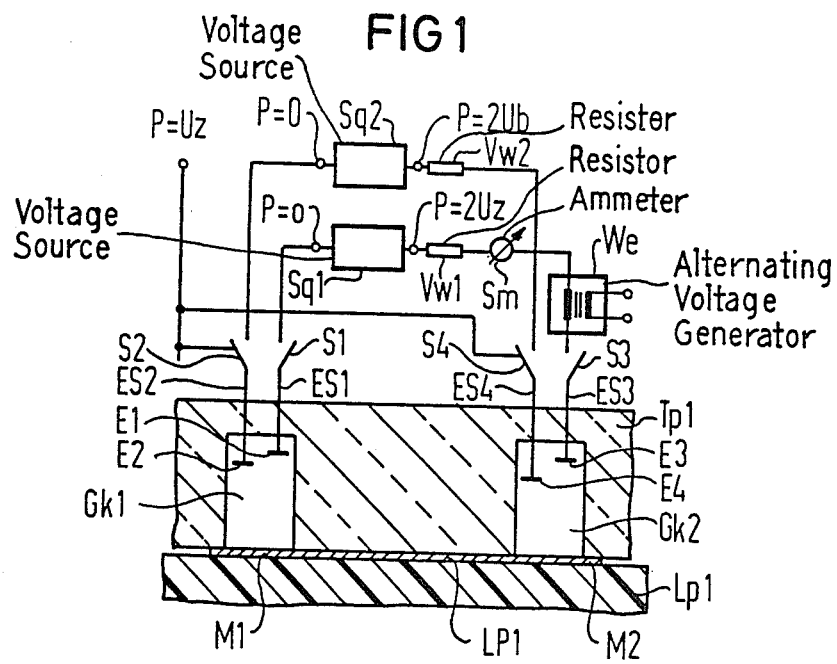
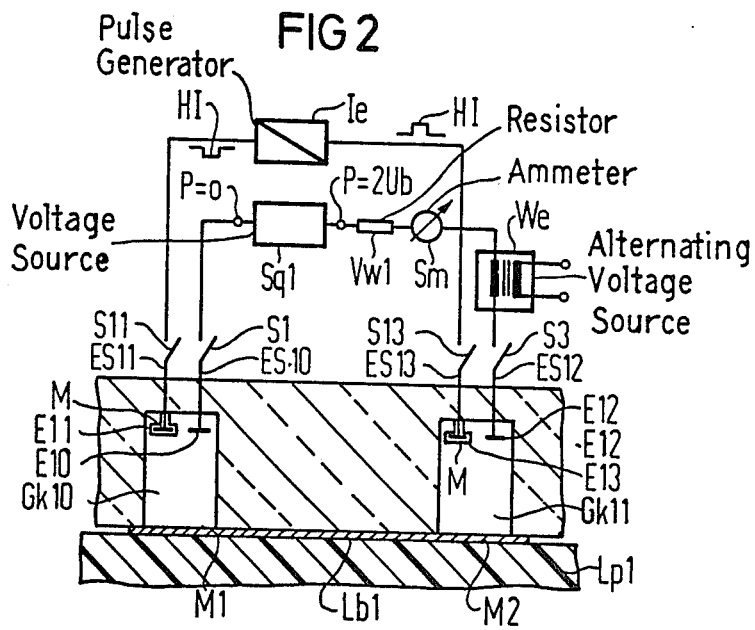

DEVICE FOR ELECTRICALLY CHECKING PRINTED CIRCUIT BOARDS

CROSS-REFERNCE TO RELATED COPENDING APPLICATION

Reference is hereby made to copending U.S. patent application of Guenter Doemens entitled: "APPARATUS FOR ELECTRICAL FUNCTION CHECKING OF WIRING MATRICES", filed simultaneously herewith, U.S. Pat. No. 4,705,329.

BACKGROUND OF THE INVENTION

1. Field of the Invention

The present invention relates to a facility for electrical function checking of wiring matrices through a plurality of gas discharge channels.

2. Description of the Prior Art

In automatic test units and test adaptors for use with both equipped and unequipped circuit boards, as well as for use with soldered or crimped wiring matrices, resilient test probes are usually used to contact the selected measuring locations. The resilient test probes are arranged in a grid pattern of a wiring matrix to be checked and are secured by spring sleeves which are pressed into a carrier plate and into which the test probes are inserted. Test probes are usually selected to accommodate the smallest spacing of the test locations relative to one another as well as to accommodate the current load across the diameter of the resilient test probes. The lower limit for the diameter dimension of the test probes is cited as 0.69 mm in the publication Elektronik Produktion & Prueftechnik, November 1979, pages 472 and 473.

Tests which can be performed include conductivity and insulation measurements between test locations of printed circuit boards according to the grid points by the known testing devices. Since the resilient test probes provided for contacting the test locations must be arranged in the grid of the printed circuit board, it is becoming increasingly difficult to overcome the difficulties for the now decreasing grid dimensions and increasing areas of printed circuit boards. Thus, with an arrangement of resilient test probes in grid dimensions of less than 1 mm, it is now difficult to precisely provide a reliable mechanical contact with the test locations. The test locations can now amount to over 100,000 on a single circuit board or wiring matrix so that the number of leads and switch elements required increases accordingly causing considerable apparatus-oriented expenditure and correspondingly high costs. Moreover, as the number of test locations increases, the probability of contacting all of the test locations of a printed circuit board decreases noticeably.

In European Patent EP-A No. 0 102 565, a facility for electrical function checking of wiring matrices is disclosed wherein standard ohmic contacting of the test locations is replaced by a non-contacting ionic contact through gas discharge paths. A carrier plate is placed on the wiring matrices and has a plurality of gas discharge channels provided with electrodes therein. The gas discharge channels are arranged in a grid of the wiring matrices and are open toward the test locations. When two selected test locations are connected to one another in an electrically conductive fashion, such as by an interconnect or land, then the respective gas discharge channels form two gas discharge paths connected in series which can be ignited by applying an adequately high voltage to the electrodes.

The ignition of the gas discharges ensues to provide a current flow which can be interpreted for test purposes. When the ignition of the gas discharges is suppressed or when the current flow is too low after an ignition has occurred, then it can be concluded that the electrically conductive connection has been interrupted or that the electrically conductive connection did not exist at all from the very outset between the selected test locations. When an AC signal superimposed over the ignition voltage is applied to the electrodes, then the phase of the resulting current change can be compared to the phase of the applied AC voltage to determine the resistance of the connection between the selected test locations.

The known apparatus, thus, enables conductivity and insulation measurements of extremely high reliability since ohmic contacts are avoided. Wiring matrices that have, for example, small grid dimensions of the test locations of down to 0.1 mm can reliably be checked through ionic contacting of the test locations by gas discharge channels since such channels are realizable in extremely small dimensions. When a high number of test locations are present on a circuit board which is being checked, however, problems attributable to the numerous leads and switch elements for connecting the electrodes of the gas discharge channels still exist.

SUMMARY OF THE PRESENT INVENTION

An object of the present invention is to drastically reduce the number of leads required in an electrical function checking facility for printed circuit boards. This and other objects are achieved in the present invention which is embodied in an electrical function checking apparatus having a plurality of gas discharge channels wherein each gas discharge channel is equipped with at least two electrodes and is selectable in accordance with the coincidence principle. Since each gas discharge channel can be equipped with at least two electrodes, the selection of one electrode by itself does not elicit an ignition and burning of a gas discharge. But, the selection of all the electrodes of a discharge channel results in a reliable ignition and burning of gas discharges. Since the selection and drive of the gas discharge channels is based on the coincidence principle, a type of matrix addressing of the test locations can be used which is comparable to addressing individual cores of a core memory. Accordingly, the gas discharge channels allocated to selected test locations can be selected by appropriate electrode bus bars. In comparison to the direct drive of each and every gas discharge channel, there is a considerable reduction in the outlay required for such a drive.

The gas discharge channel preferably includes two electrodes and is selected on the coincidence principle by two electrode bus bars. The ignition and/or burning of the gas discharge is only enabled by the interaction of both electrodes. If one of the two electrodes is not selected, there is no ignition and/or burning of the gas discharge, however, this inhibiting effect is cancelled by driving the second electrode.

In using the test facility of the present invention for electrical function checking of wiring matrices, it is preferable to ionically contact the test locations. In other words, one electrode of the gas discharge path is formed by the test location of the printed circuit board.

By avoiding ohmic contacts, an extremely high reliability is thereby achieved.

An advantage is realized by addressing in the present invention and, in particular, by matrix addressing of the gas discharge channels and their respective test locations in that a considerable reduction in wiring is realized. This advantage is also realized when ohmic contacting of the test locations is provided by resilient test probes arranged at the lower end of each gas discharge channel. The resilient test probes form a second or further electrode of the gas discharge channel which are ionically contacted on the side opposite the probe.

Such ionically contacted test probes can also be realized in smaller dimensions than traditional test probes connected to wiring. The extremely small grid dimensions possible with ionic contacting through gas discharge channels open toward the test locations, however, cannot be achieved through the use of such test probes.

In a preferred development of the present invention, it is provided that first electrodes of the gas discharge channels are connected to one another in rows by first electrode bus bars and that second electrodes of the gas discharge channels are connected to one another in rows by second electrode bus bars. Such embodiment is particularly suitable for printed circuit boards having an arrangement of test locations in a regular grid so that a particularly simple and clear application of the electrode bus bars results. Moreover, the row-wise combination of electrodes corresponds to the ideal case of a matrix addressing system of the test locations.

Further, it is especially advantageous that the first and second electrodes in each gas discharge channel be provided at a different height. One of the electrodes thereby assumes the job of a grating to control the ignition of a gas discharge with particular reliability. Therefore, utilizing the grating electrode, the gas discharge can either be prevented or initiated.

However, it is also possible to envelope the second electrodes in each discharge channel with an electrically insulating material. By charging the second electrodes with voltage pulses which act as trigger pulses, gas discharges are ignited. Moreover, the insulated second electrodes do not exert any noticeable influence on the gas discharge paths.

A further reduction in wiring outlay is possible when the electrodes are formed of crossing sections of the electrode bus bars in the gas discharge channels. When utilizing such arrangement, two selected locations cannot be addressed by a common electrode bus bar. Thus, when the first and second electrode bus bars are arranged crossing one another, preferably at approximately 45° with respect to one another, a particular benefit is realized. All testing locations can reliably be tested by turning the carrier plate having the discharge channels by an angle of either 90° or 270° relative to the wiring.

When the spacing between the first electrode and the second electrode within a gas discharge channel is small in comparison to the spacing between the second electrode and the selected test location, then the safety and reliability of the present facility is further enhanced. For a slight spacing between the first and second electrodes, no or very little ionization occurs so that an undesired gas discharge between the first and second electrodes cannot ignite. It has proven especially beneficial for the ratio of the space between the first electrode and the second electrode relative to the space between the second electrode and the selected test location to be at least 1:10.

A further reduction of the probability of unwanted gas discharge ignition between the two electrodes is provided when an electrical insulator is disposed between the first electrode and the second electrode within the discharge channel. Moreover, in such cases, it is possible to provide a particularly slight spacing between the two electrodes.

The electrode bus bars can be formed in ribbon-like fashion for simplified manufacture and layout in ways proven in the field of circuit technology. In particular, the electrode bus bars can be formed by interconnects of a film circuit.

An especially high reliability is achieved when a voltage corresponding to at least twice the ignition voltage of a gas discharge path is applied to the first electrodes of the second selected gas discharge channels through first electrode bus bars and when a voltage, by means of which an ignition of the gas discharge paths can be initiated, is applied to the second electrodes of both gas discharge channels through second electrode bus bars. All non-driven, second electrodes lie at the same potential in such an arrangement so that a type of potential screen arises to prevent undesired ignition of gas discharges in non-selected gas discharge channels.

To achieve an advantage of the present invention, all second electrode bus bars are connectable to one another with the exception of the second electrode bus bars leading to the second electrodes of the selected gas discharge channels. By doing this, the formation of a potential screen of the second electrodes is also guaranteed when not all electrode bars cross. This allows the dimensions of the carrier plate to be precisely mated to the dimensions of the printed circuit board to be tested. A means of further enhancing the functional reliability of the present device is to connect all the second electrode bus bars connected to one another to a potential which prevents ignition of the gas discharge paths.

The gas discharge channels are charged with an ionizing radiation to avoid retarded ignitions and, thereby, enhance reliability in the speed of the electrical function check. Such ionizing radiation can, for example, be in the form of ultraviolet radiation.

BRIEF DESCRIPTION OF THE DRAWINGS

FIG. 1 is a schematic diagram, partially in cross-section, of an electrical function checking facility for printed circuit boards according to the principles of the present invention;

FIG. 2 is a second embodiment of an electrical function checking facility;

DESCRIPTION OF THE PREFERRED EMBODIMENTS

Figure 3:
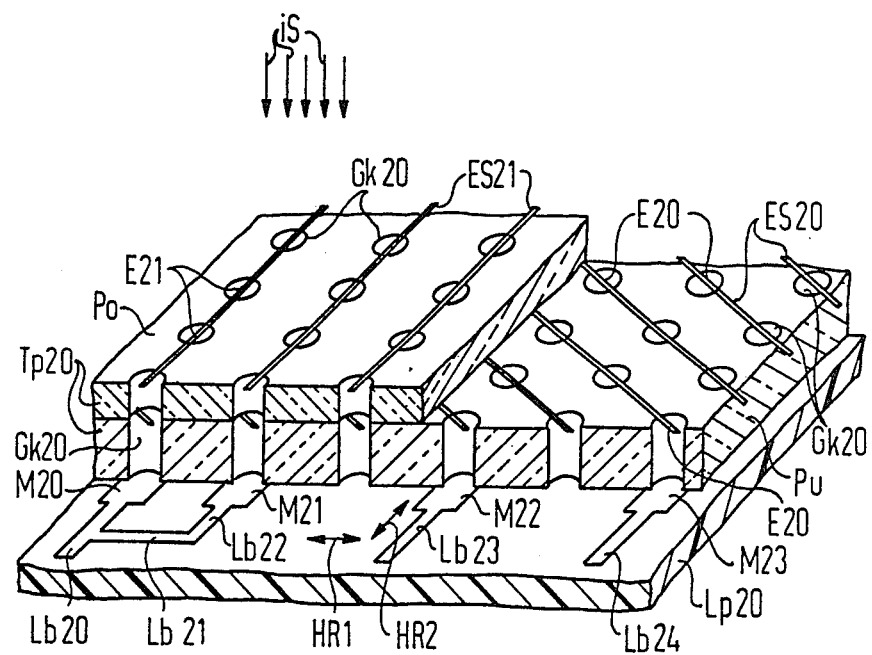
FIG. 3 is a perspective view, partially in cross-section, of a carrier plate having gas discharge channels for use as shown in FIGS. 1 and 2.

FIG. 1 shows, in a greatly simplified schematic illustration, an apparatus for function checking of printed circuit boards through non-touching ionic contacting of the test locations by gas discharge paths. A portion of a printed circuit board is referenced Lp1 which includes an interconnect Lb1 at an upper side thereof which forms test locations M1 and M2. A carrier plate Tp1 formed of insulating material such as, for example, glass, is in place at an upper side of the printed circuit board Lp1. The carrier plate Tp1 includes a plurality of gas discharge channels in the form of blind holes, only two of which Gk1 and Gk2 are shown for simplicity. The gas discharge channel Gk1 is allocated to the test location M1 and the gas discharge channel Gk2 is allocated to the test location M2. In the gas discharge channel Gk1 lying opposite the test location M1 are electrodes E1 and E2 wherein the electrode E2 extends somewhat further into the gas discharge channel Gk1 than the electrode E1. The electrode E1 is connected to an electrode bus bar ES1 and the electrode E2 is connected to an electrode bus bar ES2.

The gas discharge channel Gk2 has electrodes E3 and E4 arranged at the side opposite the test location M2. The electrode E4 lies at the same level as the electrode E2 and extends further into the gas discharge channel Gk2 than the electrode E3. The electrode E3 is connected to an electrode bus bar ES3 while the electrode E4 is connected to an electrode bus bar ES4. In the gas discharge channels, not shown in FIG. 1, electrodes contained therein are connected to one another in rows by the electrode bus bars ES1, ES2, ES3 and ES4.

When the two test locations M1 and M2 are selected for electrical function checking, then the first electrodes E1 and E3 of the respective gas discharge channels Gk1 and Gk2 are driven via the first electrode bus bars ES1 and ES3, as shown by switches S1 and S3. A voltage source Sq1, a voltage drop resistor Vw1, an ammeter means Sm1, and an alternating voltage generator We are successively arranged in series between the switches S1 and S3.

Driving the first electrodes E1 and E3 as set forth above does not alone cause a selection of the test locations M1 and M2. In order to guarantee an unequivocal selection, the second electrodes E2 and E4 of the respective gas discharge channels Gk1 and Gk2 are simultaneously driven via the electrode bus bars ES2 and ES4 in accordance with the coincidence principle. The electrical drive of the second electrodes E2 and E4 is indicated by switches S2 and S4. When in the non-driven condition, the second electrodes E2 and E4 are connected to one another as shown and to a potential $P=Uz$. Moreover, all the second electrodes which are not connected by selected second electrode bus bars are connected to this same potential $P=Uz$. When the switches S2 and S4 are switched to the second position (not shown), a voltage source Sq2 and a voltage drop resistor Vw2 ar successively connected in series between the switches S2 and S4.

The entire apparatus shown in FIG. 1 is disposed within an evacuatable space under a reduced pressure of, for example, 10 Torr. The evacuatable space is preferably filled with a gas such as nitrogen. Gas discharge paths which are connected in series by the interconnect Lp1 are formed between the first electrode E1 and the test location M1, as well as between the first electrode E3 and the test location M2.

A voltage from the voltage source Sq1 of such amplitude as to be twice the ignition voltage Uz of a gas discharge path is applied through the switches S1 and S3 to the two gas discharge paths connected in series. A potential $P=0$ is thereby applied to at the first electrode E1, whereas a potential $P=2Uz$ of the voltage source Sq1 is applied to the first electrode E3. Athough twice the ignition voltage Uz is provided at the first electrodes E1 and E3, this alone does not produce an ignition of the series connected gas discharge paths. Such an ignition is prevented by the second electrodes E2 and E4 which form a potential screen in their non-driven condition, the second electrodes E2 and E4 being shown in the illustrated embodiment at a potential of $P=Uz$. Only when the electrodes E2 and E4 are in the driven condition are they at a potential at which an ignition of the gas discharge paths can ensue through the first electrodes E1 and E3. A voltage which, for example, corresponds to twice a maintaining voltage Ub of a gas discharge path is applied to the second electrodes E2 and E4 through the switches S2 and S4. The potential $P=0$ is thereby established at the second electrode E2 while the potential $P=2Ub$ is established at the second electrode E4 from the voltage source Sq2.

When the first electrode E1 is driven through the first electrode bus bar ES1, the second electrode E2 is driven through the second electrode bus bar ES2, the first electrode E3 is driven through the first electrode bus bar ES3, and the second electrode E4 is driven through the second electrode ES4, then gas discharges are ignited in the selected gas discharge channels Gk1 and Gk2 so that the test locations M1 and M2 are connected to one another in an electrically conductive fashion. Once ignited, the gas discharges are no longer influenced by the second electrodes E2 and E4 acting as gratings. Maintenance of the two discharges is recorded by the ammeter means Sm which has been inserted into the circuit.

When the ignition fails to occur or when a current flow is too low after ignition, then a conclusion may be reached regarding an interruption of the interconnect Lb1 or regarding an electrically conductive connection which did not exist from the very outset between the test locations M1 and M2.

For measurements of resistance between the test locations M1 and M2, an alternating voltage is superimposed by the alternating voltage generator We. In the illustrated embodiment, the superimposition is undertaken by inductive coupling. Resistance measurements are taken at different cusp points of the gas discharge characteristic, whereby the alternating current practically bridges the internal resistances of the gas discharge paths. Small fluctuations $\Delta U$ of the superimposed alternating voltage produce relatively great fluctuations $\Delta I$ in the current. The phase-sensitive ammeter Sm connected in the circuit regsters the current fluctuations $\Delta I$ so that the resistance can be identified from the relationship $R=\Delta U/\Delta I$. The phase-sensitive ammeter is, for example, a commercial lock-in amplifier. Conclusions regarding potential faults are then drawn from the amplitude of the identified resistance, where the interconnect Lb1 is only partially interrupted. Further, the identification of the resistance R can also be used for insulation measurements.

A second embodiment of the present invention is shown in FIG. 2, wherein the carrier plate is referenced Tp10 and the gas discharge channels allocated to the test locations M1 and M2 are referenced Gk10 and Gk11. The drive of first electrodes E10 and E12 ensues as above through the switches S1 and S3 and corresponding first electrode bus bars ES10 and ES12. The voltage source Sq1, however, is set to a voltage corresponding to at least twice the maintaining voltage Ub of a gas discharge path but does not reach twice the ignition voltage Uz. In the illustrated embodiment, the potential P=0 is established at the first electrode E10, whereas the potential P=2Ub is established at the first electrode E12.

Second electrodes, referenced E11 and E13, of the gas discharge channels Gk10 and Gk11, respectively, are driven by electrode bus bars ES11 and ES13, respectively, through switches S11 and S13. In the driven condition, the two second electrodes E11 and E13 are connected to a pulse generator Ie which generates high voltage pulses HI of opposite polarity for igniting gas discharges. In the illustrated case, the second electrode E11 is charged with a negative high voltage pulse HI while the second electrode E13 is simultaneously charged with a positive high voltage pulse HI. The high voltage pulses HI are noticeably greater than the ignition voltage Uz so as to effect a reliable ignition of the gas discharges when the second electrodes E11 and E12 are enveloped with an electrically insulating material M, such as ceramic. Enveloping the second electrodes E11 and E13 with the electrically insulating material M has the advantage of causing the electrodes E11 and E13 to function exclusively as trigger electrodes without otherwise influencing the gas discharges.

As shown in FIG. 3, a printed circuit board Lp20 on whose surface test locations M20, M21, M22, and M23 are arranged in a grid dimension includes interconnects Lb20, Lb21, Lb22, Lb23, and Lb24. The principal directions of the interconnects perpendicular to one another are referenced HR1 and HR2. A carrier plate Tp20 is on the upper side of the printed circuit board Lp20 so that a plurality of gas discharge channels Gk20 formed in the carrier plate Tp20 are arranged over the surface of the circuit board Lp20. The carrier plate Tp20 includes an upper plate Po and a lower plate Pu and is formed of photolithographically structurable glass or moldable glass in which gas discharge channels Gk20 are introduced by standard masking and etching techniques. Straight riffles proceeding in the principal direction HR2 are introduced into the upper side of the upper plate Po with first electrode bus bars ES21 proceeding in the riffles. The first electrodes E21 of the gas discharge channels Gk20 are formed by sections of the electrode bus bars ES21 crossing the gas discharge channels Gk20. Straight riffles proceeding at an angle of 45° relative to the two principal directions HR1 and HR2 are introduced into the underside of the upper plate Po or into the upper side of the lower plate Pu with second electrode busbars ES20 proceeding in these riffles. The second electrodes E20 of the gas discharge channels Gk20 are formed by sections of the second electrode bus bars ES20 crossing the gas discharge channels Gk20. The manufacture of ribbon-shaped electrode bus bars ES20 and ES21 with the appertaining electrodes E20 and E21, respectively, are undertaken with techniques standard in the field of printed circuits or film circuits; precious metals, such as gold, being suitable for use as a material for the bus bars.

The position of the gas discharge channels Gk20 corresponds exactly to the grid of the test locations of a printed circuit board Lp20 to be tested. The precise allocation of the gas discharge channel Gk20 in the plane of the carrier plate Tp20 to the test locations M20, M21, M22, and M23 lying immediately therebelow can be seen clearly in FIG. 3. The number of gas discharge channels Gk20 arranged in rows and columns can also be greater than the number of test locations present on the printed circuit board Lp20.

The thickness of the upper plate Po is greatly exaggerated in FIG. 3. In reality, the thickness of the upper plate Po is very small in comparison to the thickness of the lower plate Pu so that the spacing between the first electrode E21 and the second electrode E20 of a gas discharge channel Gk20 is small in comparison to the spacing between the second electrode E20 and the selected test location. The small spacing between the electrodes reliably prevents undesired gas discharges between the first electrode E21 and the second electrode E20.

To prevent gas discharges between neighboring ones of first electrodes E21, or respectively, first electrode bus bars ES21, a cover plate (not shown) of insulating material is disposed over the upper side of the upper plate Po. The cover plate is preferably composed of glass so that all discharge channels Gk20 can be charged with an ionizing radiation Is, as indicated by arrows. The ionizing radiation Is promotes faster ignition and increases the reliability and speed of the electrical function check. In the preferred form, the ionizing radiation is UV radiation.

Figure 4:
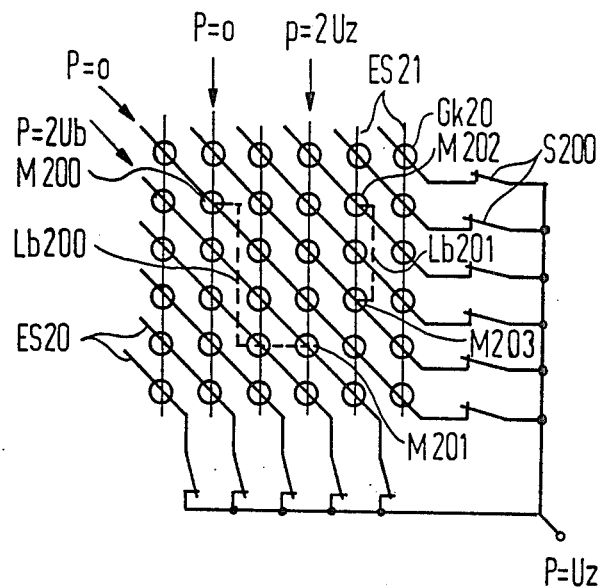
FIG. 4 is a diagram showing the principle of matrix addressing of selected test locations for the carrier plate shown in FIG. 3.

Referring now to FIG. 4, matrix addressing of selected test locations is shown in a simplified illustration of a 6×6 gas discharge channel arrangement. Each gas ischarge channel Gk20 has extending therethrough electrode bus bars ES20 and ES21. Test locations M200 and M201 lie under two of the gas discharge channels Gk20 and are supposed to be connected by an interconnect Lb200 shown in broken lines. To check the interconnect Lb200, the test locations M200 and M201 are driven as described in conjunction with FIG. 1, the drive being shown in FIG. 4 by arrows. The first electrode bus bar ES21 for the test location M200 is established at a potential of P=0, while the first electrode bus bar ES21 for the test location M201 is established at a potential of P=2Uz. Further, the second electrode bus bar ES20 for the test location M200 is applied to a potential P=0 while the second electrode bus bar ES20 for the test location M201 has a potential P=2Ub. All other second electrode bus bars ES20 are connected by switches S200 to a potential P=Uz or to some other fixed potential below the potential Uz. The prerequisites for ignition and maintenance of a gas discharge are established only in the gas discharge channels Gk20 addressed for the test locations M200 and M201.

Matrix addressing as set forth above with reference to FIG. 4 only fails when the selected test locations or gas discharge channels Gk20, have the same first electrode bus bar ES21 or the same second electrode bus bar ES20 allocated thereto. Such an instance is shown in FIG. 4 by test locations M202 and M203 which are supposed to be connected to one another by an interconnect Lb201 shown with broken lines. The test locations M202 and M203 are allocated to the same first electrode bus bar ES21. Matrix addressing of the test locations M202 and M203 and a respective checking of the interconnect Lb201 proceeds as shown in FIG. 5.

Figure 5:
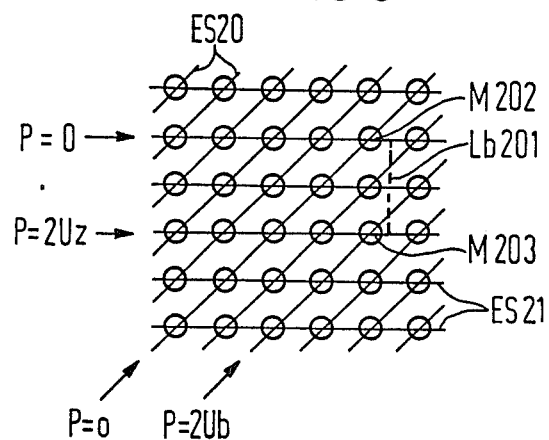
FIG. 5 is another diagram showing the principle of matrix addressing in which the carrier plate of FIG. 4 has been rotated by an angle of 90°.

In FIG. 5, the test locations M202 and M203 on the printed circuit board Lb20, as well as the interconnect Lb201, have the same position as shown in FIG. 4. However, the carrier plate Tp20 (see FIG. 3) in which the gas discharge channels Gk20 are included has been rotated in a clockwise direction by an angle of 90° in comparison with the arrangement shown in FIG. 4. It can be seen that due to this rotation and the corresponding altered course of the first electrode bus bars ES21 and of the second electrode bus bars ES20, the matrix addressing of the test location M202 and M203 is possible without further ado, as shown by the corresponding arrows.

Instead of rotating the testing apparatus, a second apparatus which is correspondingly fashioned from the very outset can be used to provide testing of all the test locations.

Figure 6:
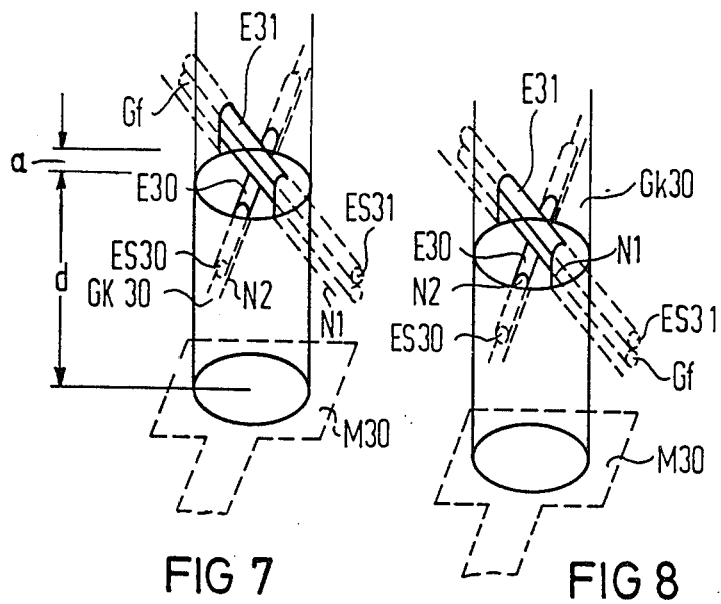
FIG. 6 is another embodiment of electrodes within gas discharge channels according to the present invention.

With reference to FIG. 6, the simplified illustration of a modified arrangement of first and second electrodes is shown, wherein only the contour of gas discharge channels Gk30 is illustrated. First electrode bus bars ES31 which form first electrodes E31 are provided in a groove N1. Second electrode bus bars ES30 which form second electrodes E30 extend along a groove N2. The spacing between the first electrode bus bars ES30 and the second electrode bus bars ES31 which cross one another at an angle of 45° is defined by electrically insulating glass fibers Gf which are also laid in the grooves N1. The glass fibers Gf enable the first electrodes E31 and the second electrodes E30 to be placed extremely close to one another without touching. The ratio of the spacing a between the first electrode E31 and the second electrode E30 to the spacing d between the second electrode E30 and a selected test location M30 is, thus, so small that no gas discharges can trigger between the first electrodes E31 and the second electrodes E30. The absence of a discharge is guaranteed when the ratio and is equal to at least 1:10.

Figure 7:
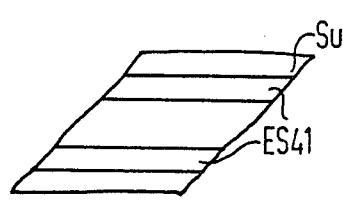
FIGS. 7–10 show various method steps for the formation of gas discharge channels in accordance with one embodiment of the present invention.
Figure 8:
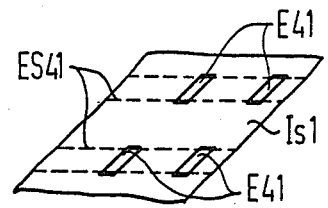
Figure 9:
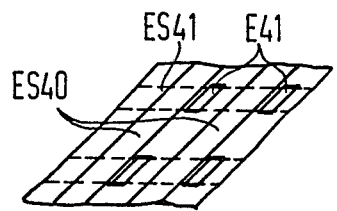

In FIGS. 7–10 are shown various method stages for arranging the first and second electrodes in accordance with another embodiment of the present invention. As shown in FIG. 7, interconnects are first applied to a substrate Su of glass using a thick-film technique. These interconnects form first electrode bus bars ES41 which proceed in parallel. In FIG. 8, a first insulating layer Is1 is applied surface-wide to the substrate Su except at windows which form first electrodes E41 along the first electrode bus bars ES41. Further interconnects are applied using thick film techniques to the first insulating layer Is1 as shown in FIG. 9. These further interconnects form second electrode bus bars ES40 which proceed parallel to one another and cross the first electrode bus bars ES41 at an angle of approximately 45°. Finally, a second insulating layer Is2 is applied surface-wide except at window regions so as to leave uncovered the first electrodes E41 and regions of the second electrode bus bars ES40 which form the second electrodes E40.

Figure 10:
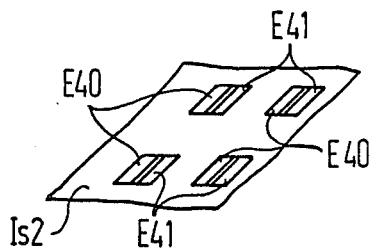

As shown in FIG. 10, only the first electrodes E41 and the second electrodes E40 are still exposed, while the remaining area is covered by the second insulating layer Is2.

The substrate Su is printed this way so that it merely has to be placed on a carrier plate with the illustrated upper side facing down; gas discharge channels in the form of holes being provided in a corresponding grid in the carrier plate. First and second electrodes E41 and E40 are then disposed at the upper end of each and every gas discharge channel in close proximity to one another and are electrically insulated from one another.

In the preferred embodiment shown in FIG. 3, the grid dimension of the test location and of the gas discharge channels Gk20 is, for example, 1/40th of an inch or about 0.6 mm. The diameter of the gas discharge channels Gk20 is approximately 0.3 mm and the spacing e between the first electrodes E21 and the selected test locations, which corresponds roughly to the thickness of the overall carrier plate Tp20, is approximately 0.5 mm. For a reduced pressure p of approximately 10 Torr, the apparatus is situated in a nitrogen atmosphere. For the product p.e=5 Torr mm, the minimum ignition voltage Uz for nitrogen is approximately 350 volts. Twice the ignition voltage or 2Uz is 700 volts, which is applied to the first electrode bus bar ES21 leading to the selected test locations and corresponding to the selected gas discharge channels Gk20. A voltage corresponding to at least twice the maintaining voltage and equaling approximately, for example, 350 volts is applied to the second electrode bus bar ES20 for the selected test locations or channels Gk20.

When a printed circuit board Lp20 having $z = n \times n$ test locations arranged in a grid is to be checked by the present apparatus, then n first electrode bus bars ES21 and (2n−1) second electrode bus bars ES20 are required by the prior art device. For a plurality of z test locations, the total number of electrode bus bars thus amounts to $Z = 3\sqrt{z} - 1$. Whereas previously, for z=10,000 test locations 10,000 leads were required by the prior art device. Now, however, only Z=299 electrode bus bars are needed for accessing the same number of test locations.

Although modifications and changes may be suggested by those skilled in the art, it is the intention of the inventors to embody within the patent warranted hereon all changes and modificatons as resonably and properly come within the scope of their contribution to the art.

We claim as our invention:

1. An apparatus for electrical function checking of wiring matrices, comprising:
   a carrier plate for emplacement onto individual ones of said wiring matrices in succession;
   a plurality of gas discharge channels in said carrier plate;
   at least two electrodes provided in each of said gas discharge channels; and
   a plurality of electrode bus bars connecting said electrodes for selection of ones of said gas discharge channels in accordance with the coincidence principle,
so that at least two respective selected test locations of the wiring matrix are ionically contactable by selected ones of said gas discharge channels and respective ones of said electrodes.

2. An apparatus as claimed in claim 1, wherein all of said gas discharge channels are chargeable with an ionizing radiation.

3. An apparatus as claimed in claim 1, wherein said electrodes are formed of sections of said electrode bus bars which cross said gas discharge channels.

4. An apparatus as claimed in claim 3, wherein said electrode bus bars are formed as ribbon-shaped electrodes.

5. An apparatus as claimed in claim 4, wherein said electrode bus bars are formed by interconnects of a film circuit.

6. An apparatus as claimed in claim 1, wherein first ones of said electrodes of said gas discharge channels are connected to one another in rows by first ones of said electrode bus bars; and wherein second ones of said electrodes of said gas discharge channels are connected to one another in rows by second ones of said electrode bus bars.

7. An apparatus as claimed in claim 6, wherein said first electrodes and said second electrodes are disposed at different height levels within said gas discharge channels.

8. An apparatus as claimed in claim 6, wherein said second electrodes are enveloped with an electrically insulating material.

9. An apparatus as claimed in claim 6, wherein a first spacing between said first electrodes and said second electrodes in said gas discharge channels is small in comparison to a second spacing between said second electrodes and respective test locations on a wiring matrix.

10. An apparatus as claimed in claim 9, wherein the ratio of said first spacing to said second spacing is at least 1:10.

11. An apparatus as claimed in claim 6, wherein a voltage corresponding to at least twice an ignition voltage of a gas discharge path is applied to said first electrodes of two selected gas discharge channels through respective ones of said first elctrode bus bars, and wherein a second voltage is applied to said second electrodes of said two selected gas discharge channels through respective ones of said second electrode bus bars to initiate an ignition of said gas discharge paths.

12. An apparatus as claimed in claim 11, wherein all of said second electrode bus bars are connectable to one another with the exception of said second electrode bus bars leading to said second electrodes of the selected ones of said gas discharge channels.

13. An apparatus as claimed in claim 12, wherein said second electrode bus bars are connected to one another and are connectable to a potential to prevent ignition of the gas discharge paths.

14. An apparatus as claimed in claim 6, wherein said first electrode bus bars and said second electrode bus bars are disposed crossing one another.

15. An apparatus as claimed in claim 14, wherein said first electrode bus bars and said second electrode bus bars cross one another at an angle of approximately 45°.

16. An apparatus as claimed in claim 15, further comprising an electrical insulator between said first electrode and said second electrode of a gas discharge channel.

17. A function checking device for electrical testing of test locations on printed circuit boards, comprising:

a carrier plate of insulating material for placement over individual ones of said pointed circuit boards in succession;

a plurality of gas discharge channels in the form of blind holes extending into a first side of said carrier plate, at least some of said gas discharge channels for placement in registration with the test locations;

first and second electrodes disposed within each of said plurality of gas discharge channels adjacent a blind end of said gas discharge channels;

a plurality of first electrode bus bars connecting said first electrodes in rows;

first voltage supply means connectable to selected ones of said first electrode bus bars for supplying an ignition voltage to said selected bus bars;

a plurality of second electrode bus bars connecting said second electrodes in rows;

second voltage supply means connectable to selected ones of said second electrode bus bars for supplying an ignition voltage to said selected bus bars, an ignition voltage present simultaneously on said first and second electrodes in a single gas discharge channel being conducive for an ignition of a gas discharge between one of said first and second electrodes and a corresponding test location, the existence of and character of the gas discharge being indicative of the electrical characteristics of the test location and the circuit board.

18. A function checking device as claimed in claim 17, wherein at least one of said first voltage supply means and said second voltage supply means includes an ammeter and an alternating voltage generator.

19. A function checking device as claimed in claim 17, wherein at least portions of said carrier plate opposite said blind ends of said gas discharge channels are transparent to ultraviolet radiation.

20. A function checking device as claimed in claim 17, further comprising:

means for connecting non-selected ones of said second electrode bus bars to an ignition blocking voltage.

* * * * *